United States Patent

Müeller et al.

[11] 4,389,280
[45] Jun. 21, 1983

[54] METHOD OF MANUFACTURING VERY THIN SEMICONDUCTOR CHIPS

[75] Inventors: Jan-Erik Müeller, Ottobrunn; Dietrich Ristow, Neubiberg; Hermann Kniepkamp, Munich, all of Fed. Rep. of Germany

[73] Assignee: Siemens Aktiengesellschaft, Berlin & Munich, Fed. Rep. of Germany

[21] Appl. No.: 325,316

[22] Filed: Nov. 27, 1981

[30] Foreign Application Priority Data

Nov. 28, 1980 [DE] Fed. Rep. of Germany ....... 3044947

[51] Int. Cl.³ ...................... H01L 21/306; B44C 1/22; C03C 15/00; C03C 25/06
[52] U.S. Cl. ...................................... 156/645; 29/580; 156/655; 156/662
[58] Field of Search ............... 156/628, 645, 648, 655, 156/657, 662; 29/580, 583

[56] References Cited

U.S. PATENT DOCUMENTS 3,054,709  9/1962  Freestone et al. ............... 156/662 X
3,623,219  11/1971  Stoller et al. ........................... 29/580
3,953,919  5/1976  Moore .............................. 156/648 X

FOREIGN PATENT DOCUMENTS 1964546  7/1970  Fed. Rep. of Germany .

Primary Examiner—William A. Powell
Attorney, Agent, or Firm—Hill, Van Santen, Steadman, Chiara & Simpson

[57] ABSTRACT

Very thin semiconductor chips are produced from a relatively large semiconductor substrate (such as gallium arsenide substrate) by generating a select pattern of crystallographic stress areas in a front surface of the substrate, as by mechanical scoring or application of a layer of material having a coefficient of thermal expansion significantly different from that of the semiconductor material in a pattern corresponding to the desired chip; applying an etch-resistant carrier member to such stressed front surface and etching the entire back surface of the substrate into a thickness less than 50 μm, whereby the etching reaction penetrates into the region of the crystallographic stress and a division of the resultant eroded body into individual chips corresponding to the selected patterns occurs, with the chips being carried by said carrier member.

7 Claims, 5 Drawing Figures

METHOD OF MANUFACTURING VERY THIN SEMICONDUCTOR CHIPS

BACKGROUND OF THE INVENTION

1. Field of the Invention

The invention relates to manufacture of semiconductor chips and somewhat more particularly to manufacture of very thin chips from a semiconductor material having at least one privileged cleavage plane whereby individual chips are attained by division of a larger substrate body which is caused to divide with pressure occurring in the surface of the semiconductor material along the cleavage plane.

2. Prior Art

It is desirable to have very thin semiconductor chips available for high frequency components as well as for power components, such as for example, varactors or gallium-arsenide power field-effect transistors. With thin chips, heat dissipation of a component producec on such semiconductor chips is more favorable and/or the intermediate electrical resistance is smaller than with comparatively thicker semiconductor bodies.

Heretofore, thin semiconductor chips have been produced by eroding the inactive or back surface of thicker substrate bodies by polishing or polishing-etching down to a remaining thickness of about 50 $\mu$m or less. The resultant substrate body, which was only then considered adequately thin, was then placed on a support and scratched or scored with a diamond tool in such a manner (generally crosswise) that individual chips of a desired size were attained by subsequent breaking along the score lines, just like cutting a glass plate.

With the foregoing prior art technique, the substrate body utilized had a crystal lattice orientation so that the direction of pressure exerted thereon by the diamond tool during scoring was along one of the fracture planes of the semiconductor material.

Although the foregoing technique has been very widely utilized, it cannot be considered optimum because of the high rejection rate associated therewith. Further, often times the active or front surface of a substrate body on which the score line is traced on the back surface, becomes damaged or scratched during the subsequent breaking process. This causes particularly severe damage when details of a semiconductor component or circuit are already present on the front or active side of such substrate body.

SUMMARY OF THE INVENTION

The invention provides a method of manufacturing very thin semiconductor chips with a thickness of 50 $\mu$m or less, which is free of the prior art disadvantages, provides a very high yield and during which damage to the front or active side of a substrate body is impossible.

In accordance with the principles of the invention, a select pattern of crystallographic stress is generated in the surface of a front or active side of a relatively large semiconductor substrate, as by appropriate mechanical scoring or application of a patterned layer of material having a coefficient of thermal expansion significantly different from that of the semiconductor substrate, an etch-resistant protective cover layer is provided on the resultant front surface and the back surface of the resultant assembly is then etched on its entire back surface into a thickness of 50 $\mu$m or less, whereby the etching reaction penetrates into the region of the crystallographic stress in the surface so that a division of the resultant eroded body into individual chips corresponding to the select pattern of stress occurs. Before etching a carrier-plate or foil is applied to the surface with said produced stress; this carrier plate carrying said chips still after said division into said chips occurred.

In one embodiment of the invention, somewhat similar to the prior art, a permanent destruction of the substrate crystal structure, (i.e., a mechanically stressed area) is provided at a specific location due to scoring or due to the pressure exerted during scoring. In another embodiment of the invention, crystallographic stress is generated in surface areas of a semiconductor substrate with the assistance of a patterned layer of material having a coefficient of thermal expansion significantly different from the coefficient of thermal expansion of the substrate. Thus, an advantage of the first embodiment is that the mechanical scoring of a substrate can occur on such substrate bodies which still have a relatively large thickness of, for example, 300 $\mu$m, in comparison to the prior art (in which substrate bodies can only have thickness of ranging from 50 $\mu$m to at most 100 $\mu$m in order to enable such bodies to undergo subsequent processing). The mechanical stress in the semiconductor body generated by scoring extends into the inside of the crystalline body to a depth up to about 100 $\mu$m.

A substrate body first provided with a select pattern of stress (i.e., score lines) is then positioned or applied with its stressed face (i.e., scored surface) onto a glass carrier or to a synthetic (plastic) film and attached thereto as by gluing with wax or Pizein, for example. Thereafter, the so-assembled semiconductor substrate is subjected to etching, beginning from its entire back surface, in a manner fundamentally known in a different context as thin-etching. Initially, an isotropic etching reaction occurs on the semiconductor material. However, as soon as the etching of the semiconductor material advances sufficiently that the substrate body is only of 50 $\mu$m or less in thickness, the etching reaction encounters areas of the semiconductor material in which crystal structure disruption caused by the stress applied to the front surface (i.e., scoring or coating) exists. In any event such etching reaction produces a very thin substrate body, weakened in its mechanical stability at locations thereof at which it was stressed (scored) on its front surface (i.e., opposite to the surface being etched). When the remaining thickness of a substrate body is about 50 $\mu$m or less (for example for a gallium-arsenide body), the above state is reached and the substrate body breaks by itself into individual semiconductor chips along the stress or score line. Advantageously, however, the individual chips are still held together by the carrier plate or carrier foil on the front surface of the original substrate body. This being of particular significance since the carrier can be a type of carrier film.

When a glass carrier or plastic film carrier is substantially transparent, the point of time at which the substrate body breaks into individual chips during the etching process is relatively easily optically determined although all chips are still kept together. This fact can be advantageously exploited to make the termination of the etching process dependent on an optical signal generated at this stage of the etched substrate body or be exploited to control the etching process. Optical radiation penetrating the protective carrier body or film on the front surface of the semiconductor body and penetrating the body itself provides an appropriate signal indicating the occurrence of this condition, i.e., breakage of the semiconductor body, and can be picked-up and evaluated in an appropriate manner by a suitable detector. In this manner, with a given degree of stress in the substrate body due to scoring or due to application of a patterned coating of a select material, the etching process can always be terminated at an identical preselected remaining thickness of the etched substrate body.

The thin-etching of the substrate body or of the carried semiconductor chips may be continued beyond the thickness dimension sufficient for division of the chips. The etching process can be continued without interruption and may be terminated when the predetermined thickness of 50 μm or less is attained, that is after a desired time, determined by the material etching rate.

Mechanical fracturing of the substrate body, as is necessary with the prior art techniques using substrate bodies with 50 μm to 100 μm earlier described, is eliminated with the practice of the invention.

The above explanations of the principles of the invention were based on generation of continuous stress lines (as by scoring) on a substrate surface. However, in many instances, the same results are attainable when the substrate body is only scored at an edge area thereof at those locations at which continuous score lines would meet or intersect such edge. The fracture of the substrate body into individual chips then proceeds from the disruption of the crystal structure impressed only at edges of the body and by a subsequent etching. In this manner, a particularly clean fracture surface is attained which can be exploited, for example for chips used in laser diodes.

A variation of the inventive principle, which as already been mentioned, consists, instead of scoring the front surface of a semiconductor substrate body, of applying a patterned coating of a material having a significantly different coefficient of expansion from that of semiconductor material. For example, a 0.5 μm thick layer of silicon dioxide can be applied in a selected pattern onto a gallium arsenide substrate. This layer is applied in such a pattern that strip-shaped interruptions corresponding to outer edges of the desired chips to be produced are provided, i.e., the strip-shaped interruptions are along those areas of the substrate surface which would otherwise be scored. Thus, the surface areas of the substrate body remain free of the exemplary silicon dioxide layer in a pattern on the surface of the substrate which correspond to a lattice bordering the edges of the desired chips. The applied layer of silicon dioxide or silicon nitride generates crystalographic stresses close to the surface in the crystal structure of the semiconductor body and such stresses have practically the same effect as the scoring, i.e., breaking of the semiconductor substrate body into chips when a thickness of about 50 μm or less is reached by etching.

With the inventive process, typically the etching process can already be terminated when a substrate breaks into individual semiconductor chips. However, the etching process may be continued. Such chips remain anchored to a glass carrier plate or a plastic carrier film.

BRIEF DESCRIPTION OF THE DRAWINGS

FIG. 3 also illustrates the principle of optical monitoring of a remaining thickness of an etched semiconductor body in accordance with the principles of the invention;

DESCRIPTION OF THE PREFERRED EMBODIMENTS

Figure 1:
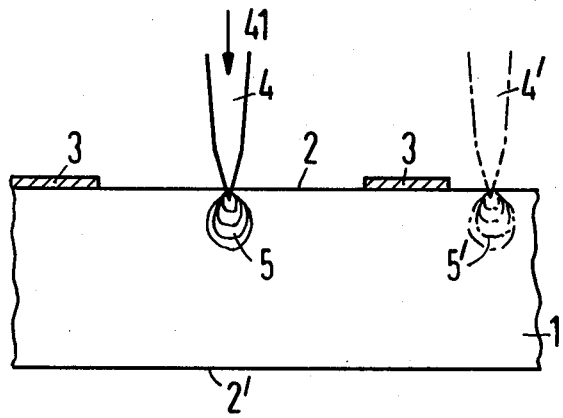
FIG. 1 is a partial, elevated, partially in phantom, highly schematic view showing generation of mechanical stress in a semiconductor substrate by scoring in accordance with the principles of the invention.

A portion of a substrate body 1 composed of a semiconductor material, such as gallium arsenide, is illustrated at FIG. 1. In the exemplary embodiment shown, electrode metallizations 3 are already positioned on the front or active surface 2 of the body 1, opposite to a back or inactive surface 2′ of body 1. In accordance with an exemplary embodiment of the invention, the surface 2 is scored with a diamond tool or point 4 generating crystallographic stress area 5. The scoring pattern being produced by tool 4 on surface 2 corresponds to a desired predetermined division of body 1 into individual chips. A subsequent position 4′ of the tool is shown in phantom and corresponds to a neighboring score line in the score pattern generated on surface 2 of body 1. At position 4′, the tool generates a corresponding crystallographic stress area 5′. The so-generated stress areas are permanently generated by the pressure of tool 4 pressing against surface 2 of body 1. The direction of the applied pressure (schematically indicated with arrow 41) of tool 4 is preferably aligned parallel to a natural cleavage plane of the semiconductor material forming body 1, i.e., a suitable crystal surface is selected for body 1 as the surface 2.

Figure 2:
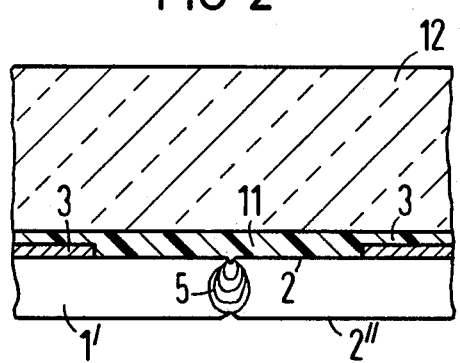
FIGS. 2 and 3 are somewhat similar views of a stressed semiconductor substrate undergoing subsequent processing in accordance with the principles of the invention.

FIG. 2 illustrates an advanced stage of the inventive method. Between the stage shown at FIG. 1 and that of FIG. 2, a glass plate 12 was applied to surface 2 of substrate body 1 as a protective carrier member, with the aid of an adhesive layer 11. The so-assembled structure was then subjected to etching from the entire back surface (surface 2′ in FIG. 1) and at the stage illustrated at FIG. 2, a considerable portion of the semiconductor material has already been etched away from the entire back surface of the body 1. Thus, in the illustration, a much thinner body 1′ having a freshly generated back surface 2″ is shown. The substrate body 1′ shown at FIG. 2 has already been etched to such a thinness that the etching reaction on surface 2″ necessarily has reached the crystallographic stress area 5. As a rule, it already suffices to terminate the etching at the stage illustrated at FIG. 2 because at this stage, a fracture or division of the body 1 along the area of stress 5 already occurs by itself and, and particularly, due to the existing, although slight, large-surface stresses in body 1′.

A continuation of the etching process beyond the stage shown at FIG. 2 leads to a slight increased etching in the area of stress 5 so that the break points become even more pronounced.

Figure 3:
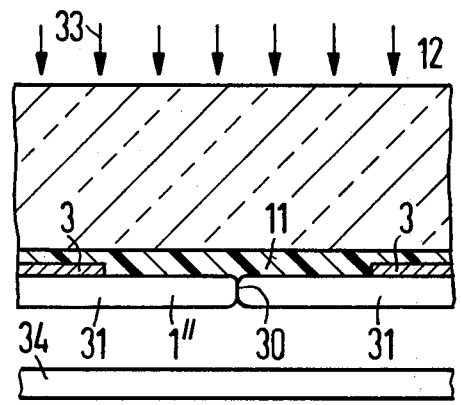

FIG. 3 illustrates a fracture crack 30 which beomes a cleavage edge of a finished semiconductor chip 31.

Individual semiconductor chips, such as chips 31, are attained after they have been removed from the glass carrier plate 12.

In FIG. 3, a light beam is shown as being irradiated through transparent glass plate 12 and the attached semiconductor body 1'. An optical detector 34 is positioned below the body 1' and receives an optical signal so as to enable it to determine the progress of the etching reaction.

Figure 4:
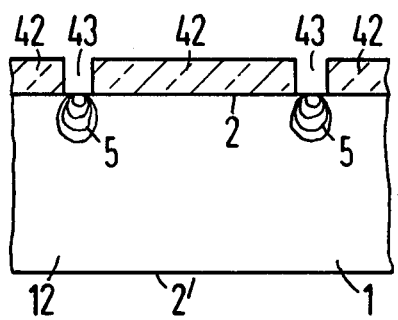
FIG. 4 is a view somewhat similar to that of FIG. 1 and illustrates generating stresses in a semiconductor substrate in accordance with an alternative embodiment of the invention.

FIG. 4 illustrates another embodiment of the invention wherein a portion of the semiconductor substrate body 1 is shown having its front surface 2 covered with a layer 42, for example composed of silicon dioxide or silicon nitride and having select interruptions 43 therein. The interruptions or gaps 43 are located at those areas in which a cleavage edge (such as edge 30 in FIG. 3) and division of the semiconductor chip is desired. Beneath gaps 43, crystallographic stress areas 5 arise and extend downwardly into the body 1, similarly to the corresponding stress areas discussed in conjunction with FIG. 1. As described in FIG. 2, the etch-resistant and supporting carrier plate 12 then is glued to the layer 4 on the stressed surface 2 of the substrate body in preparation of supporting and etching from the backside, i.e., etching from surface 2'. The etching then proceeds as before until the semiconductor body 1 attains a thickness of 50 μm or less. A (predetermined) cleavage or division edge, similar to edge 30 in FIG. 3, then occurs and produces semiconductor chips. After being removed from the carrier plate 12, such chips are individuals and are then available for further processing as single chips. The residue of coating 42 applied during the first step, which can remain on a single chip after removal of the carrier plate and associated wax or the like, can be removed in a known manner (with suitable solvents, etc.) or can remain thereon as a passivation.

In instances where a substrate body is composed of gallium arsenide, known mixtures of phosphoric acid, hydrogen peroxide and water can, for example, comprise a suitable etching agent. In instances of other semiconductor material substrates, the art is aware of suitable etchants.

Figure 5:
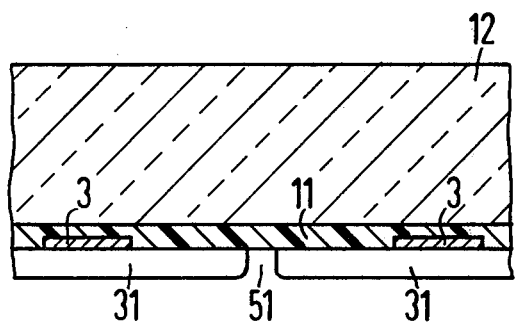
FIG. 5 is an elevated, highly schematic partial view of results attained by continued etching beyond the time required for a substrate body to break into individual chips.

FIG. 5 illustrates a portion of an assembly which has been processed in accordance with another embodiment of the invention. In this embodiment, the etching is allowed to continue beyond the time when cleavage edges (such as edge 30 in FIG. 3) arose. An increased etching reaction in the area of crystallographic stress (such as stress are 5 produced by mechanical scoring, as in FIG. 1 or by application of a patterned coating, as in FIG. 4) can be allowed and proceeds to such an extent that a gap 51, as shown in FIG. 5 is generated between neighboring chips 31, while a remaining thickness of the original substrate body is nonetheless of a predetermined thinness for the desired chips. The so-generated chips 31 are still anchored onto the glass carrier plate 12. Very thin chips produced in accordance with the embodiment of the invention illustrated at FIG. 5 can be processed and furnished with contacts on the back surface (2'') as electrodes and/or as cooling members.

As is apparent from the foregoing specification, the present invention is susceptible of being embodied with various alterations and modifications which may differ particularly from those which have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a process for producing components from a substrate body composed of a semiconductor material having at least one privileged cleavage direction whereby individual components are produced by separation from a larger substrate body, to which end said substrate body is superficially notched in a select pattern on a front surface of said body and thereafter provided with a protective covering on said front surface, and said body is subjected to an etching proceeding from a rear surface of said body in such a manner that the etchant penetrates into the semiconductor material of the substrate body in which there is inhomogeneity of semiconductor material impressed by the notching extending from the front surface of the substrate body, so that a separation into individual components then occurs, wherein the improvement comprises:

for the manufacture of semiconductor chips (31) having a thickness of only less than 50 μm as said components, said etching occurs surface-wide up to a prescribed thickness value of less than 50 μm; and said protective covering on the front surface (2) of said substrate body (1) is selected and dimensioned as a carrier (12) for further support of the individual thin chips (31) which arise as a result of the separation (30).

2. In a method as defined in claim 1, wherein said covering carrier (12) is transparent.

3. In a method as defined in claim 1, wherein said front surface (2) of the substrate body (1) is notched only along edges thereof.

4. In a method as defined in claim 3, wherein said covering carrier (12) is transparent.

5. In a process for producing components from a substrate body composed of a semiconductor material having at least one privileged cleavage direction whereby individual components are produced by separation from a larger substrate body, to which end said substrate body is provided with inhomogeneity superficially produced in the semiconductor material on a front surface of said body and thereafter provided with a protective covering on said front surface, and said body is subjected to an etching process proceeding from a rear surface of said body in such a manner that the etchant penetrates into the semiconductor material of the body in which the inhomogeneity of semiconductor material is impressed proceeding from said front surface of the substrate body, so that a separation into individual components occurs; wherein the improvement comprises:

for manufacture of semiconductor chips (31) having a thickness of only less than 50 μm as said components, said front surface (2) of the substrate body (1) is covered with a layer (42) composed of a material whose coefficient of thermal expansion significantly differs from the coefficient of thermal expansion of the semiconductor substrate body (1), said layer (42) being provided with strip-shaped interruptions (43) corresponding to outer edges or, respectively, to cleavage edges of the chips being manufactured;

said front surface (2) of substrate body (1) having said layer (42) thereon is provided with a covering which is selected and dimensioned as a carrier (12)

for further support of the individual thin chips (31) which arise as a result of the separation (30); and said etching process occurs surface-wide proceeding from said back surface (2') of said substrate body (1) up to a prescribed thickness value less than 50 μm.

6. In a method as defined in claim 5, wherein said layer (42) on the front surface (2) of said substrate body (1) is composed of a material selected from the group consisting of silicon dioxide and silicon nitride.

7. In a method as defined in claim 6, wherein said covering carrier (12) is transparent.

* * * * *